(12) United States Patent
Cheng et al.

(10) Patent No.: US 10,075,152 B2
(45) Date of Patent: Sep. 11, 2018

(54) INTEGRATED CIRCUIT WITH MULTIPLEXED PIN AND PIN MULTIPLEXING METHOD

(71) Applicant: JOULWATT TECHNOLOGY (HANGZHOU) CO., LTD., Hangzhou (CN)

(72) Inventors: Yang Cheng, Hangzhou (CN); Pitleong Wong, Hangzhou (CN); Yuancheng Ren, Hangzhou (CN); Xunwei Zhou, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 0 days.

(21) Appl. No.: 15/715,096

(22) Filed: Sep. 25, 2017

(65) Prior Publication Data
US 2018/0091126 A1    Mar. 29, 2018

(30) Foreign Application Priority Data
Sep. 23, 2016    (CN) .......................... 2016 1 0843448

(51) Int. Cl.
*H03K 5/02* (2006.01)
*H03K 5/125* (2006.01)
*H03K 5/24* (2006.01)

(52) U.S. Cl.
CPC ............... *H03K 5/125* (2013.01); *H03K 5/24* (2013.01)

(58) Field of Classification Search
None
See application file for complete search history.

(56) References Cited

U.S. PATENT DOCUMENTS

2012/0112816 A1*  5/2012  Wang ........................ G06F 1/28
                                                                                                  327/427

* cited by examiner

*Primary Examiner* — Cassandra Cox
(74) *Attorney, Agent, or Firm* — Perkins Coie LLP

(57) ABSTRACT

The present invention provides an integrated circuit with a multiplexed pin and a pin multiplexing method. The multiplexed pin of the integrated circuit extends out with two connecting ends to receive two logic level signals which are finally restored in a chip. A first signal input end receives a signal representing whether to enable or disable, a second signal input end receives a function signal which achieves a certain function, and a diode, a resistor, and a first current source are used together to achieve multiplexing of the pin based on turn-on and clamping characteristics of the diode. The number of pins to be packaged and the area occupied by a chip on board are reduced, which is conducive to a small package design of the chip.

20 Claims, 3 Drawing Sheets

INTEGRATED CIRCUIT WITH MULTIPLEXED PIN AND PIN MULTIPLEXING METHOD

CROSS-REFERENCE TO RELATED APPLICATIONS

This Non-provisional application claims priority under 35 U.S.C. § 119(a) on Patent Application No(s). 201610843448.9 filed in People's Republic of China Sep. 23, 2016, the entire contents of which are hereby incorporated by reference.

BACKGROUND OF THE INVENTION

Field of the Invention

The present invention relates to the technical field of integrated circuits, and, more particularly, relates to an integrated circuit with a multiplexed pin and a pin multiplexing method.

Description of the Related Art

Transistors, resistors, capacitors, inductors and other components as well as wiring required in a circuit are interconnected and fabricated on one or several tiny blocks of semi-conductor wafers or dielectric substrates adopting a certain process, and then packaged together in a package to form an integrated circuit, which is also referred to as a chip.

Pins are provided on the chip for connecting peripheral circuits. Usually, the input of a high-level signal and a low-level logic signal into a chip needs two input pins, for example, one pin for receiving a signal representing enablement and the other pin for receiving a signal to-be-processed or achieving a certain function.

Taking a low noise block downconverter (LNB) chip for example, the LNB chip in the prior art, as shown in FIG. 1, has a special EXTM pin used for receiving signals at 22 kHz and a special EN pin for receiving enable signals. Such a chip uses quite a lot of pin resources and is not conducive to small-package design, so this technical problem is bound to drive people to make creative labor to reduce the number of pins.

BRIEF SUMMARY OF THE INVENTION

In view of this situation, the present invention provides an integrated circuit with a multiplexed pin and a pin-multiplexing LNB chip which can achieve input of a high-level signal and a low-level logic signal via one pin, to solve the technical problem in the prior art that pin multiplexing cannot be achieved.

One technical solution of the present invention is to provide an integrated circuit with a multiplexed pin based on the following structure, comprising:
a multiplexed pin for receiving a high-level signal and a low-level signal, the multiplexed pin having a first connecting end and a second connecting end;
a diode having an anode and a cathode, the first connecting end being connected with the anode of the diode, and the cathode of the diode being used as a first signal input end;
a resistor, one end being connected with the second connecting end, and the other end being used as a second signal input end; and
an on-chip circuit, comprising a first current source and a comparison circuit, wherein the first current source is electrically connected with the multiplexed pin, the comparison circuit is electrically connected with the first current source, the comparison circuit compares a voltage on the multiplexed pin with a first threshold voltage to obtain a signal representing an input at the first signal input end, and the comparison circuit compares the voltage on the multiplexed pin with a second threshold voltage to obtain a signal representing an input at the second signal input end.

Preferably, the first signal input end may be used as an enable end, the second signal input end may be used as a function signal input end, and when the first signal input end receives a characterization enable signal, the integrated circuit may be enabled, and the comparison circuit may output signals corresponding to an enable signal and corresponding to a function signal, respectively.

Preferably, the comparison circuit may include a first comparator and a second comparator, a first input end of the first comparator may be connected with the multiplexed pin, a second input end of the first comparator may receive the first threshold voltage, and an output end of the first comparator may output a first comparison signal; a first input end of the second comparator may be connected with the multiplexed pin, a second input end of the second comparator may receive the second threshold voltage, and an output end of the second comparator may output a second comparison signal.

Preferably, a voltage division circuit and a first capacitor may be further provided at the multiplexed pin, an input end of the voltage division circuit may receive the function signal, an output end of the voltage division may be connected with the second signal input end, and the first capacitor may be connected in parallel with the resistor.

Preferably, when the first threshold voltage is greater than a forward turn-on voltage drop of the diode, the first signal input end may receive the low-level signal representing disablement, and the integrated circuit may be disabled.

Preferably, when the first signal input end receives the high-level signal, the sum of a voltage of the high-level signal and the forward turn-on voltage drop of the diode may be greater than the second threshold voltage, the second threshold voltage may be greater than a voltage drop of the first current source on the resistor, and the voltage drop of the first current source on the resistor may be greater than the first threshold voltage.

Preferably, when the second signal input end receives a high-level function signal, the sum of a voltage of the high-level function signal and the voltage drop of the first current source on the resistor may be greater than the second threshold voltage.

Another technical solution of the present invention is to provide an LNB chip with the following structure, comprising any one of the integrated circuit with the multiplexed pin described above:

Preferably, the second signal input end may receive a square wave signal.

Compared with the prior art, the circuit structure and the method disclosed by the invention have the following advantages: in the present invention, the integrated circuit has a multiplexed pin which extends out with two connecting ends to receive two logic level signals which are finally restored in a chip. The first signal input end receives the signal representing whether to enable or disable, the second signal input end receives the function signal for achieving a certain function, and the diode, the resistor, and the first current source are used together to realize the multiplexing of the pin based on the turn-on and clamping characteristics of the diode. The number of pins to be packaged and the area occupied by a chip on board are reduced, which is conducive to a small package design of the chip.

DETAILED DESCRIPTION OF THE INVENTION

The preferred embodiments of the present invention are further described in detail hereafter in combination with the accompanied drawings, but they are not intended to limit the present invention. Any substitutions, modifications and equivalent methods and solutions without departure from the spirit and scope of the invention shall all be included in the present invention.

In order to provide a thorough understanding of the present invention for the public, the preferred embodiments of the present invention are described in detail as follows, but those skilled in the art can still fully understand the invention without the detailed description.

The present invention is further illustrated in the following paragraphs with reference to the accompanied drawings. It should be noted that all the drawings, given in a simplified form and on a non-precise scale, are used for assisting in describing the embodiments of the present invention in an easy and clear way only.

Figure 1:
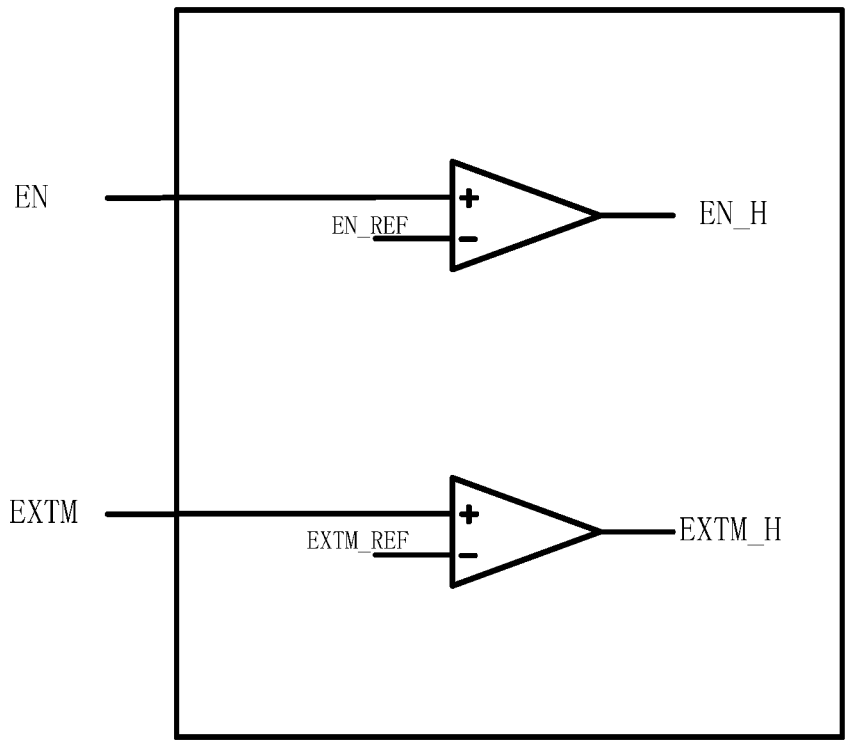
FIG. 1 is a structural diagram of pins of an integrated circuit in the prior art.
Figure 2:
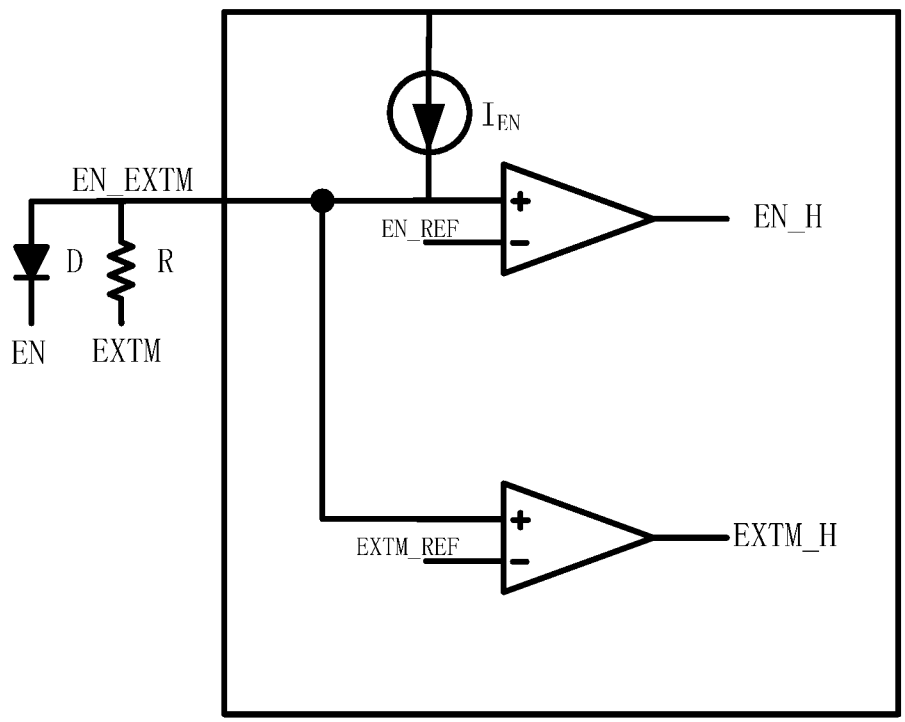
FIG. 2 is a structural diagram of an integrated circuit with a multiplexed pin of the present invention.

FIG. 2 shows an integrated circuit with a multiplexed pin, including a multiplexed pin and an on-chip circuit working in coordination therewith. The pin of the integrated circuit is modified to have a multiplexing function by adding a peripheral application circuit, and the multiplexed pin is mainly directed towards having two logic level signals as input signals of the multiplexed pin. The multiplexed pin extends out with two connecting ends, wherein a first connecting end is connected with an anode of a diode, and a cathode of the diode is used as a first signal input end of this connecting end; a second connecting end is connected with one end of a resistor, and the other end of the resistor is used as a second signal input end of this connecting end. The on-chip circuit includes a first current source $I_{EN}$ and a comparison circuit. The first current source $I_{EN}$ is electrically connected with the multiplexed pin, the comparison circuit compares a voltage on the multiplexed pin with a first threshold voltage EN_REF to obtain a signal representing an input at the first signal input end, and the comparison circuit compares a voltage on the multiplexed pin with a second threshold voltage EXTM_REF to obtain a signal representing an input at the second signal input end.

The embodiment of FIG. 2 can be applied to an LNB circuit. In the prior art, two logic level input signals EN and EXTM need to be input via two pins, respectively, while the EXTM pin and EN pin are multiplexed as an EN_EXTM pin in this embodiment, reducing the number of packaged pins and conducive to the small package design of the chip. As shown in FIG. 2, a connecting end EXTM is connected with the multiplexed pin EN_EXTM via a resistor R (the resistance thereof is also set to R), a connecting end EN is connected with the multiplexed pin EN_EXTM via a diode D, and the connecting end EN is connected with a cathode of the diode. The chip including the on-chip circuit may flow out a current $I_{EN}$ to the multiplexed pin EN_EXTM.

The internal determination method of the chip can be set as below: when the input voltage is higher than EN_REF, the chip begins to operate, i.e. being enabled. When the input voltage jumps above and below EXTM_REF, a square wave signal is considered to have been input. The input voltage herein refers to an input voltage on the multiplexed pin and is determined by the combined action of the diode D, the resistor R and the first current source $I_{EN}$.

When a high-level signal is input at the connecting end EN, a low-level signal of 0 is input at the connecting end EXTM, the sum of the high level and $I_{EN}*R$ is a 22 kHz square wave signal higher than EXTM_REF, and the chip can simultaneously receive the EN high-level signal and a 22 kHz input signal of the connecting end EXTM.

Figure 3:
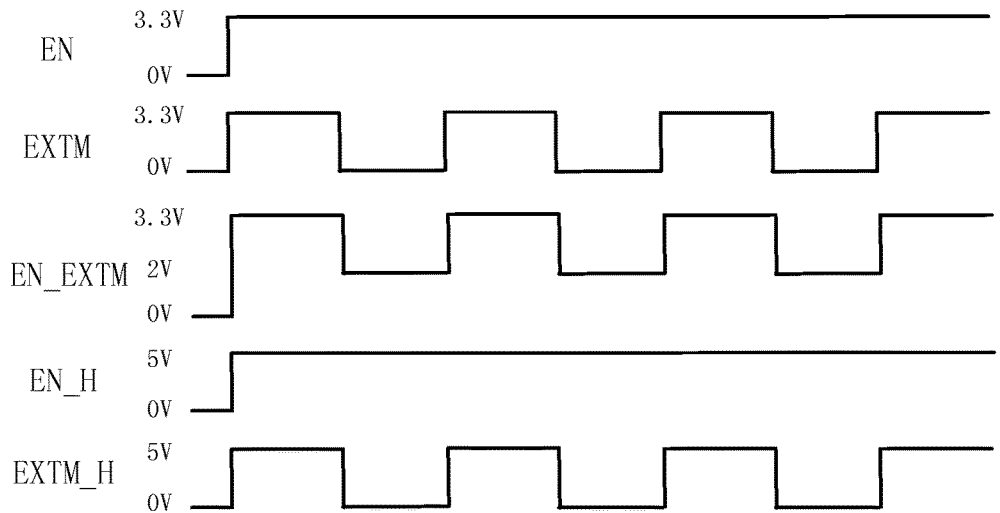
FIG. 3 is an operating waveform graph corresponding to the integrated circuit with the multiplexed pin of FIG. 2.

FIG. 3 shows a working waveform corresponding to the integrated circuit with the multiplexed pin as shown in FIG. 2. The figure shows the waveforms of EN, EXTM, EN_EXTM, EN_H and EXTM_H, and EN_H and EXTM_H are output signals of a first comparator and a second comparator in the comparison circuit, respectively.

To achieve a better implementation effect, external devices and internal reference are set as follows in a specific operation:
1. EN_REF>Vd (Vd is a forward turn-on voltage drop of an external diode);
2. $V_{EN}$ (EN input is at a high level)+ Vd>EXTM_REF>$I_{EN}*R$>EN_REF;
3. $V_{EXTM}$ (EXTM input is at a high level)+ $I_{EN}*R$>EXTM_REF.

The specific state is as below:
1. EN receives a low level: at this moment no matter what a state the EXTM input is in, the EN_EXTM voltage is always being clamped around the forward turn-on voltage drop Vd of the diode; according to Setting Condition 1, if EN_REF>Vd, the first comparator output EN_H is at a low level and the chip cannot be enabled.
2. EN is at a high level and EXTM is at a low level: according to Setting Condition 2, the external diode is not turned on, and EN_EXTM voltage is equal to $I_{EN}*R$. The voltage is between EN_REF and EXTM_REF, and thus EN_H is at a high level while EXTM_H is at a low level; EN is at a high level, and EXTM is at a high level: according to Setting Condition 3, the EN_EXTM signal is higher than EXTM_REF, and thus EN_H is at a high level and EXTM_H is at a high level.

Based on the foregoing, when EN is at a high level and EXTM receives a 22 kHz square wave signal: when the EXTM signal is at a low level during half a period, EN_H is at a high level and EXTM_H is at a low level. When the EXTM signal is at a high level during half a period, according to Setting Condition 3, the EN_EXTM signal is higher than EXTM_REF. Thus, EN_H is at a high level, and EXTM_H is at a high level. Therefore, EXTM_H restores the 22 kHz signal in the chip.

Figure 4:
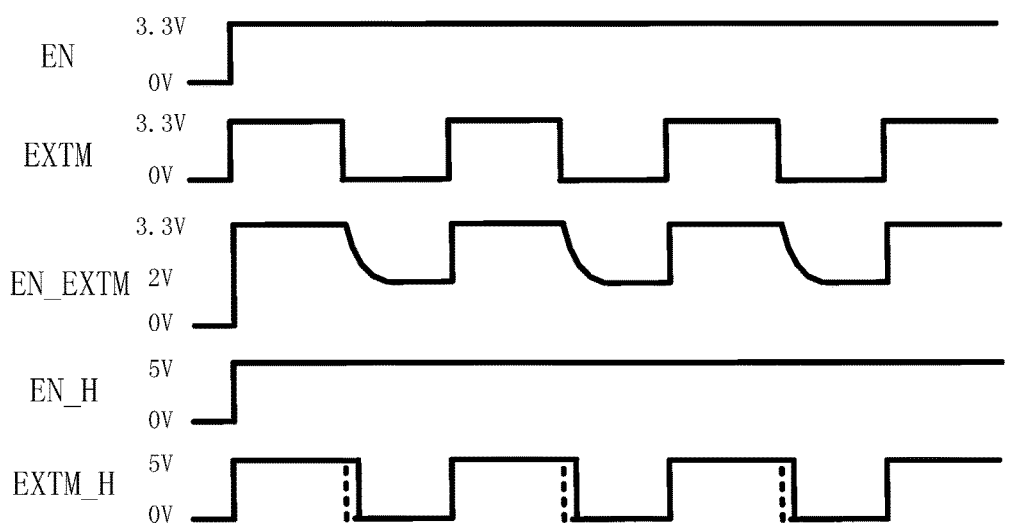
FIG. 4 is an operating waveform graph of the embodiment of FIG. 2 when a parasitic capacitance of a diode is relatively high.

Please refer to FIG. 4, which illustrates a working waveform when the parasitic capacitance of the diode is relatively high in the embodiment as shown in FIG. 2. In practice, if the parasitic capacitance of the used diode D is relatively high, an overly-gentle falling edge of the EN_EXTM signal may appear, which affects the quality of 22 kHz signal restoration in the chip and may have a certain effect on its duty cycle. Comparing the EXTM waveform, EN_EXTM waveform and EXTM_H waveform as shown in FIG. 4, the falling edge in dashed lines of the EXTM_H waveform is a theoretical value while that in solid lines is the actual situation.

Figure 5:
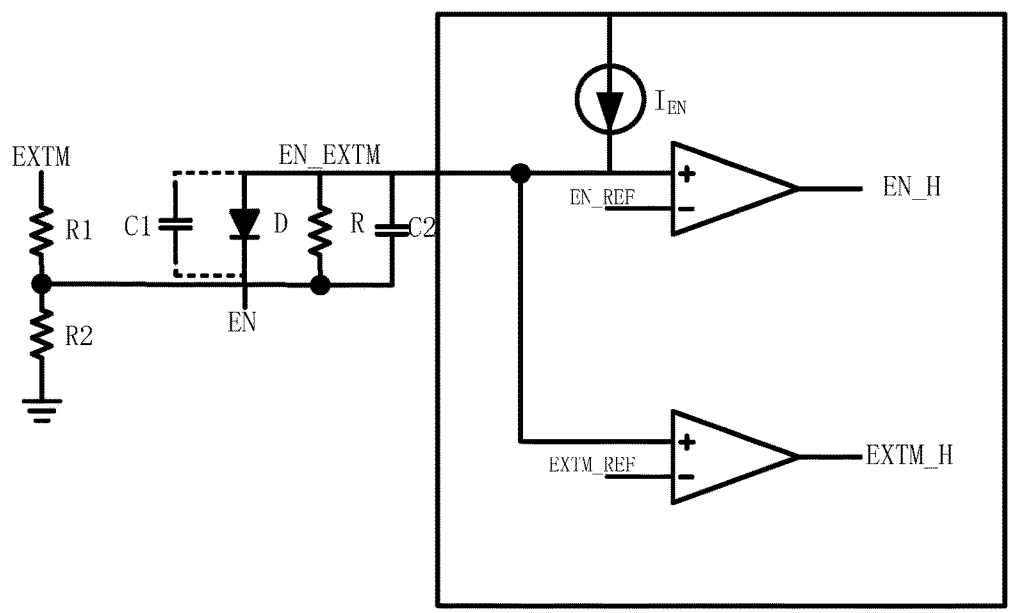
FIG. 5 is a structural diagram of another embodiment of the present invention.

Please refer to FIG. 5, which illustrates a circuit structure of an improved embodiment relative to that in FIG. 2 of the present invention. The above-described is a possible phenomenon, and if this phenomenon occurs, the falling edge of the EN_EXTM signal can be steepened by adding several components in the peripheral circuit. R1 and R2 are connected in series to form a voltage division circuit with their common end connected with one end of the resistor R, and the input end of the voltage division circuit is used as the second signal input end EXTM. Wherein the values of R1 and R2 need to ensure that the square wave amplitude VPP after voltage division of EXTM meets the conditions as below: $V_{EN}+Vd-EN\_REF>VPP>EXTM\_REF-IEN*R$, and the value of the capacitance of a first capacitor C2 (the first capacitor C2 is connected in parallel with the resistor R) needs to be significantly higher than that of a parasitic capacitor C1. In this way, when EXTM rises, due to the coupling of the first capacitor C2, EN_EXTM rises rapidly and finally stays at $V_{EXTM}*R2/(R1+R2)+I_{EN}*R$. When EXTM drops, the coupling of the first capacitor C2 also makes EN_EXTM drop rapidly. At that time, in order to meet the condition of the square wave peak VPP, the EN_EXTM voltage is reduced not to such an extent as to be lower than EN_REF which causes the turn-off of the chip. In the embodiment, the rising and falling edges of EN_EXTM can be steepened, so as to optimize the duty ratio of the inner 22 kHz signal and accurately restore the EXTM input signal at EXTM_H.

Additionally, the embodiments are described and illustrated above separately, but to those skilled in the art, techniques in common can be substituted and integrated among the embodiments; in case some aspect of one of the embodiments is not clearly described, another embodiment having the description on the aspect can be referred.

The above-described embodiments are not intended to limit the protection scope of the technical solution. Any amendments, equivalent substitutions and modifications made within the spirit and principle of the embodiments above shall all be included in the protection scope of the technical solution.

What is claimed is:

1. An integrated circuit with a multiplexed pin, comprising:
   a multiplexed pin for receiving a high-level signal and a low-level signal, the multiplexed pin having a first connecting end and a second connecting end;
   a diode having an anode and a cathode, the first connecting end being connected with the anode of the diode, and the cathode of the diode being used as a first signal input end;
   a resistor, one end being connected with the second connecting end, and the other end being used as a second signal input end; and
   an on-chip circuit, comprising a first current source and a comparison circuit, wherein the first current source is electrically connected with the multiplexed pin, the comparison circuit is electrically connected with the first current source, the comparison circuit compares a voltage on the multiplexed pin with a first threshold voltage to obtain a signal representing an input at the first signal input end, and the comparison circuit compares the voltage on the multiplexed pin with a second threshold voltage to obtain a signal representing an input at the second signal input end.

2. The integrated circuit with the multiplexed pin as claimed in claim 1, wherein the first signal input end is used as an enable end, the second signal input end is used as a function signal input end, and when the first signal input end receives a characterization enable signal, the integrated circuit is enabled, and the comparison circuit outputs signals corresponding to an enable signal and corresponding to a function signal, respectively.

3. The integrated circuit with the multiplexed pin as claimed in claim 1, wherein the comparison circuit comprises a first comparator and a second comparator, a first input end of the first comparator is connected with the multiplexed pin, a second input end of the first comparator receives the first threshold voltage, and an output end of the first comparator outputs a first comparison signal; a first input end of the second comparator is connected with the multiplexed pin, a second input end of the second comparator receives the second threshold voltage and an output end of the second comparator outputs a second comparison signal.

4. The integrated circuit with the multiplexed pin as claimed in claim 2, wherein the comparison circuit comprises a first comparator and a second comparator, a first input end of the first comparator is connected with the multiplexed pin, a second input end of the first comparator receives the first threshold voltage, and an output end of the first comparator outputs a first comparison signal; a first input end of the second comparator is connected with the multiplexed pin, a second input end of the second comparator receives the second threshold voltage and an output end of the second comparator outputs a second comparison signal.

5. The integrated circuit with the multiplexed pin as claimed in claim 1, wherein a voltage division circuit and a first capacitor are further provided at the multiplexed pin, an input end of the voltage division circuit receives a function signal, an output end of the voltage division is connected with the second signal input end, and the first capacitor is connected in parallel with the resistor.

6. The integrated circuit with the multiplexed pin as claimed in claim 1, wherein when the first threshold voltage is greater than a forward turn-on voltage drop of the diode, the first signal input end receives the low-level signal representing disablement, and the integrated circuit is disabled.

7. The integrated circuit with the multiplexed pin as claimed in claim 5, wherein when the first threshold voltage is greater than a forward turn-on voltage drop of the diode, the first signal input end receives the low-level signal representing disablement, and the integrated circuit is disabled.

8. The integrated circuit with the multiplexed pin as claimed in claim 1, when the first signal input end receives the high-level signal, the sum of a voltage of the high-level signal and a forward turn-on voltage drop of the diode is greater than the second threshold voltage, the second threshold voltage is greater than a voltage drop of the first current source on the resistor, and the voltage drop of the first current source on the resistor is greater than the first threshold voltage.

9. The integrated circuit with the multiplexed pin as claimed in claim 5, when the first signal input end receives the high-level signal, the sum of a voltage of the high-level signal and a forward turn-on voltage drop of the diode is greater than the second threshold voltage, the second threshold voltage is greater than a voltage drop of the first current source on the resistor, and the voltage drop of the first current source on the resistor is greater than the first threshold voltage.

10. The integrated circuit with the multiplexed pin as claimed in claim 6, wherein when the second signal input end receives a high-level function signal, the sum of a voltage of the high-level function signal and a voltage drop of the first current source on the resistor is greater than the second threshold voltage.

11. The integrated circuit with the multiplexed pin as claimed in claim 7, wherein when the second signal input end receives a high-level function signal, the sum of a voltage of the high-level function signal and a voltage drop of the first current source on the resistor is greater than the second threshold voltage.

12. An LNB chip, comprising the integrated circuit with the multiplexed pin as claimed in claim 1.

13. The LNB chip as claimed in claim 12, wherein the second signal input end receives a square wave signal.

14. An LNB chip, comprising the integrated circuit with the multiplexed pin as claimed in claim 2.

15. An LNB chip, comprising the integrated circuit with the multiplexed pin as claimed in claim 3.

16. An LNB chip, comprising the integrated circuit with the multiplexed pin as claimed in claim 5.

17. An LNB chip, comprising the integrated circuit with the multiplexed pin as claimed in claim 6.

18. An LNB chip, comprising the integrated circuit with the multiplexed pin as claimed in claim 8.

19. An LNB chip, comprising the integrated circuit with the multiplexed pin as claimed in claim 10.

20. An LNB chip, comprising the integrated circuit with the multiplexed pin as claimed in claim 11.

* * * * *